（12） United States Patent
Nadkarni et al.

(10) Patent No.: US 9,396,794 B1
(45) Date of Patent: Jul. 19, 2016

(54) MATCHLINE RETENTION FOR MITIGATING SEARCH AND WRITE CONFLICT

(71) Applicant: QUALCOMM Incorporated, San Diego, CA (US)

(72) Inventors: Rahul Nadkarni, Cary, NC (US); Manish Garg, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/827,235

(22) Filed: Aug. 14, 2015

(51) Int. Cl.
*G11C 15/00* (2006.01)
*G11C 15/04* (2006.01)
*G11C 11/419* (2006.01)

(52) U.S. Cl.
CPC .............. *G11C 15/04* (2013.01); *G11C 11/419* (2013.01)

(58) Field of Classification Search
USPC .................................. 365/49.11, 49.15, 49.17
See application file for complete search history.

(56) References Cited

U.S. PATENT DOCUMENTS

| 6,188,629 | B1 | 2/2001 | Kaplinsky |
| 6,373,738 | B1 | 4/2002 | Towler et al. |
| 7,289,345 | B2 | 10/2007 | Funahashi et al. |
| 7,382,637 | B1* | 6/2008 | Rathnavelu ............ G11C 15/00 365/189.05 |
| 8,462,532 | B1 | 6/2013 | Argyres |
| 2006/0233011 | A1* | 10/2006 | Matsuoka ................ G06F 7/74 365/49.17 |
| 2014/0198551 | A1 | 7/2014 | Louie et al. |

* cited by examiner

*Primary Examiner* — Vu Le
(74) *Attorney, Agent, or Firm* — Muncy, Geissler, Olds & Lowe, P.C.

(57) ABSTRACT

Systems and methods relate to a matchline receiver of a content-addressable memory (CAM). A matchline of the CAM, which provides a hit/miss indication for a search operation of a data word is provided to the matchline receiver. The matchline receiver comprises a retention circuit to provide a hit/miss output, wherein the retention circuit retains, at the hit/miss output, the hit/miss indication provided by the matchline during a first clock phase of a clock, even if the hit/miss indication provided by the matchline is modified by a write operation or an invalidation operation during the first clock phase.

21 Claims, 11 Drawing Sheets

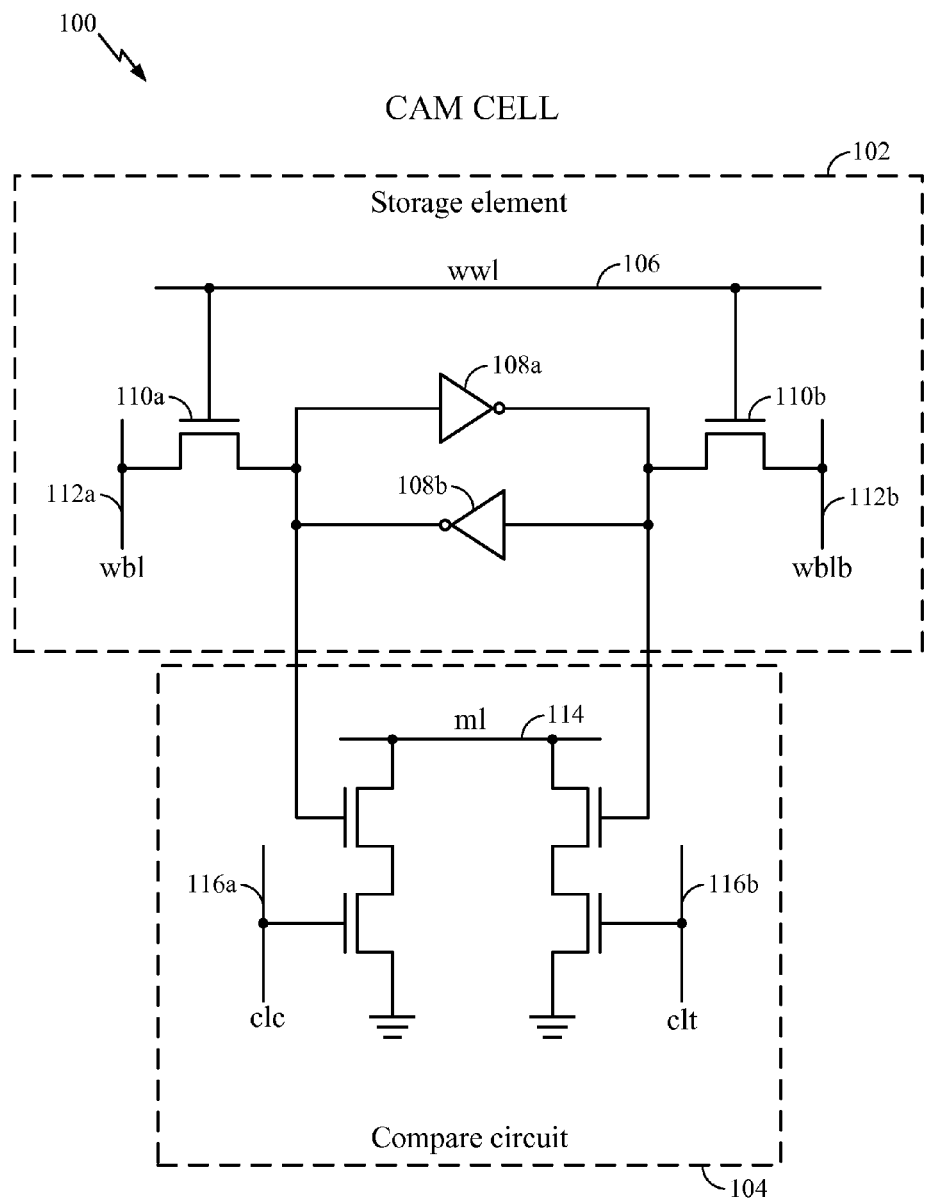
CONVENTIONAL
FIG. 1

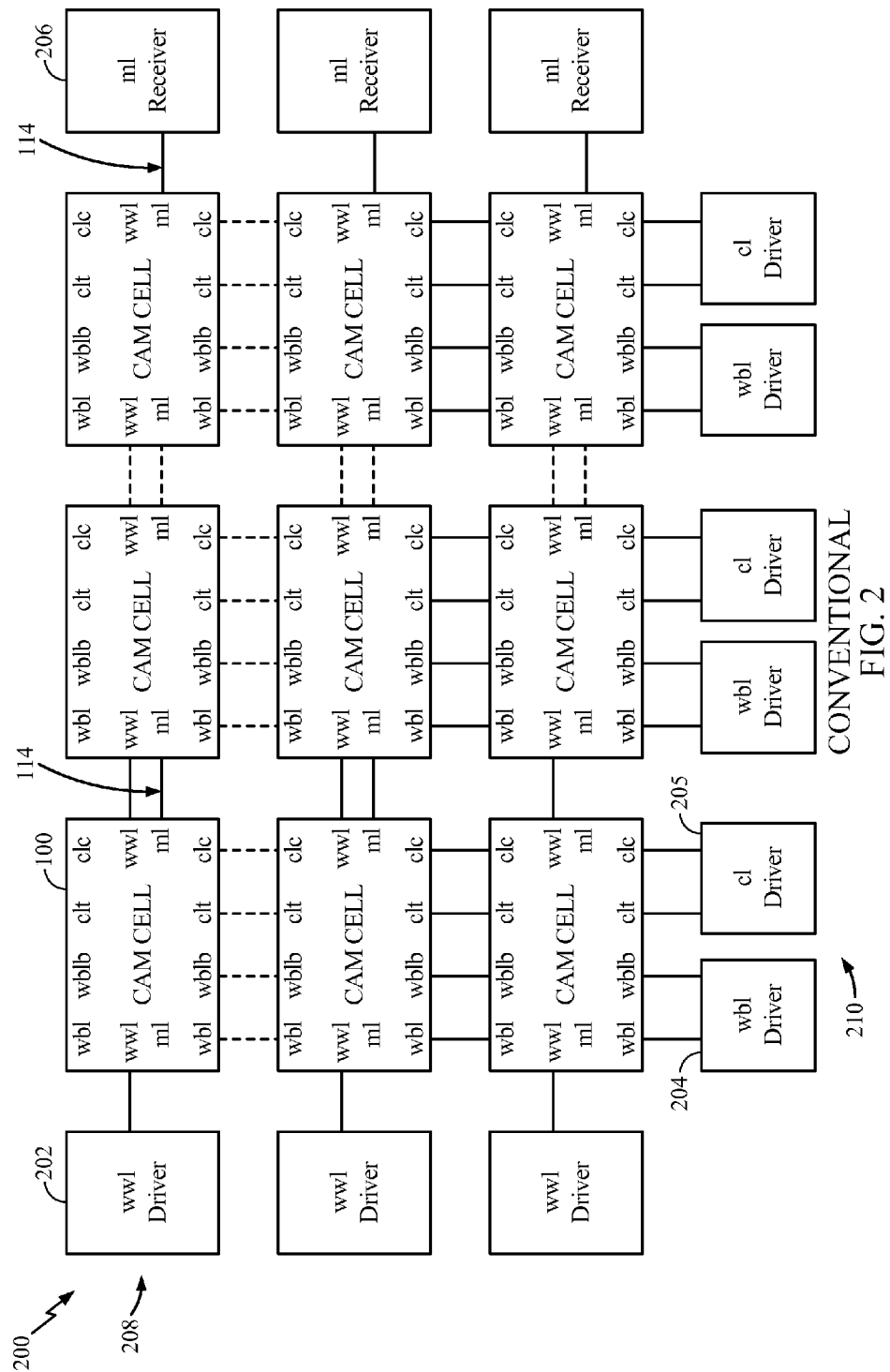
CONVENTIONAL
FIG. 2

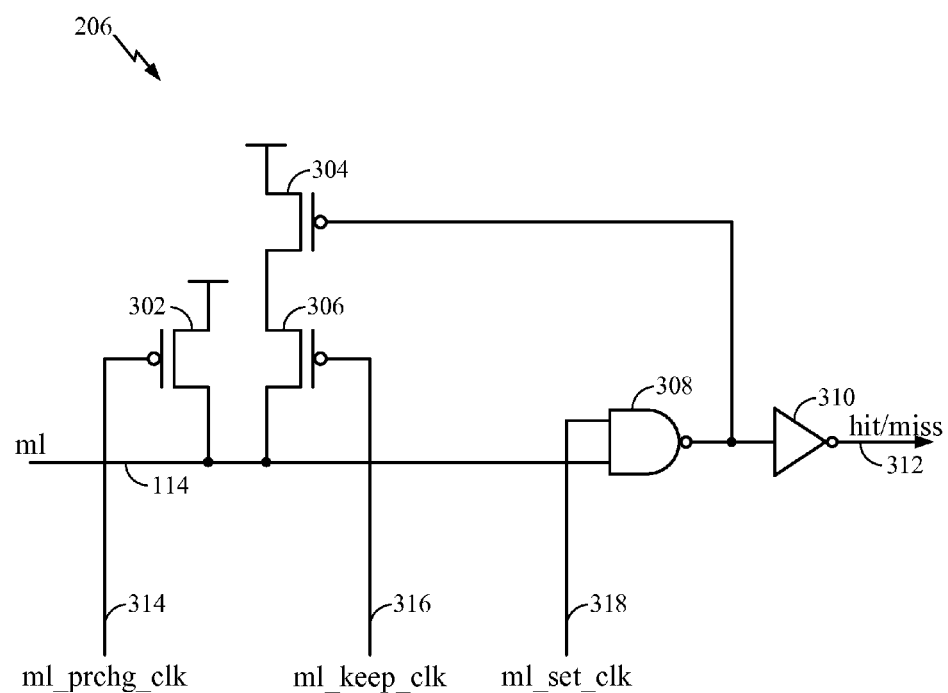
CONVENTIONAL
FIG. 3

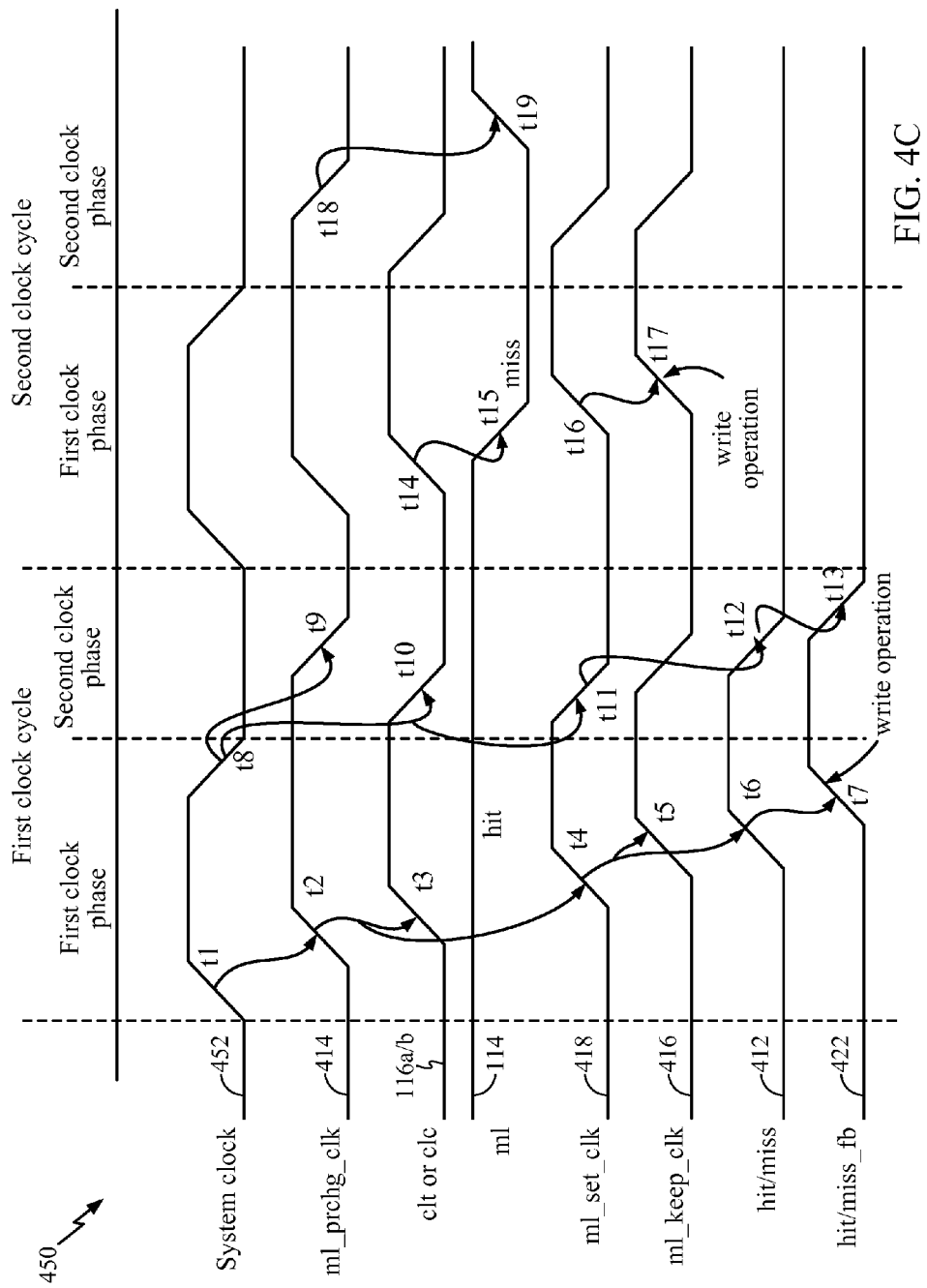

MATCHLINE RETENTION FOR MITIGATING SEARCH AND WRITE CONFLICT

FIELD OF DISCLOSURE

Disclosed aspects relate to content addressable memories (CAMs) and more specifically to matchline receivers of CAMs designed to eliminate or mitigate effects of search and write conflicts.

BACKGROUND

Content addressable memories (CAMs) are high-speed associative memory structures which may be used to determine address mappings or translations, for example. A CAM is accessed using the content that may be stored therein. For example, a data word of interest can be stored anywhere in a CAM, and all entries of the CAM are searched to see if the data word is present. If present, an index or address where the data word is found is returned by the CAM.

In order to implement the above functionality of searching through all entries for each access, a CAM may be implemented as an array comprising CAM cells arranged in rows and columns, with each CAM cell including a storage cell (e.g., a static random access memory (SRAM) cell) and comparison circuitry. Each row of CAM cells may store a data word. The comparison circuitry for a storage cell in a row may be coupled to a matchline that indicates whether a data word being searched matches the stored data word in the row.

For improved performance, it is desirable to allow a CAM array to be searched for a first data word, for example, in parallel with writing a second data word to be stored in the CAM. However, since searching for the first data word in the CAM involves searching all rows for the first data word, it is possible that there is a simultaneous search operation for the first data word and a write operation for the second data word on the same row. This simultaneous search and write on a row is referred to as a search and write conflict on the row. A search and write conflict can cause a potential match or hit (e.g., for the first data word that is searched) to turn into a miss because the stored data word is overwritten by the write of the second data word. It is also possible that the first data word may not be present in the CAM, but a write of the second data word to a searched row may turn the miss for the first data word into a hit or a match due to the second data word being written to the searched row. If a miss for a row is turned into a match or a hit, the matchline for the row may be caused to float, thus entering an unknown or unpredictable state.

Conventional efforts to mitigate search and write conflicts involve preventing search operations from taking place in the same clock cycle as write operations, which leads to poor performance, as noted above. Accordingly, there is a need for eliminating or mitigating the negative effects of search and write conflicts in CAMs, without degrading performance.

SUMMARY

Exemplary aspects are directed to systems and methods related to a matchline receiver of a content-addressable memory (CAM). A matchline of the CAM, which provides a hit/miss indication for a search operation of a data word, is provided to the matchline receiver. The matchline receiver comprises a retention circuit to provide a hit/miss output, wherein the retention circuit retains, at the hit/miss output, the hit/miss indication provided by the matchline during a first clock phase of a clock, even if the hit/miss indication provided by the matchline is modified by a write operation or an invalidation operation during the first clock phase.

An exemplary aspect is directed to an apparatus comprising a matchline receiver configured to receive a matchline of a content-addressable memory (CAM), wherein the matchline is configured to provide a hit/miss indication for a search operation of a data word of the CAM corresponding to the matchline. The matchline receiver comprises a retention circuit configured to retain, on a hit/miss output, the hit/miss indication provided by the matchline during a first clock phase of a clock, even if the matchline is modified during the first clock phase.

Another exemplary aspect is directed to a method of operating a matchline receiver, the method comprising receiving a hit/miss indication for a search operation of a data word of a content-addressable memory (CAM) from a matchline corresponding to the data word, and retaining the hit/miss indication at a hit/miss output of the matchline receiver during a first clock phase of a clock, even if the hit/miss indication provided by the matchline is modified during the first clock phase.

Yet another exemplary aspect is directed to an apparatus comprising means for receiving a hit/miss indication for a search operation of a data word of a content-addressable memory (CAM) from a matchline corresponding to the data word, and means for retaining the hit/miss indication at a hit/miss output of the matchline receiver during a first clock phase of a clock, even if the hit/miss indication provided by the matchline is modified by a write operation or an invalidation operation during the first clock phase.

BRIEF DESCRIPTION OF THE DRAWINGS

The accompanying drawings are presented to aid in the description of embodiments of the invention and are provided solely for illustration of the embodiments and not limitation thereof.

FIG. 1 illustrates a conventional CAM cell.

FIG. 2 illustrates a conventional CAM array.

FIG. 3 illustrates a conventional matchline receiver.

FIG. 4C illustrates a timing diagram corresponding to the matchline receivers of FIGS. 4A-B.

DETAILED DESCRIPTION

Figure 4A:
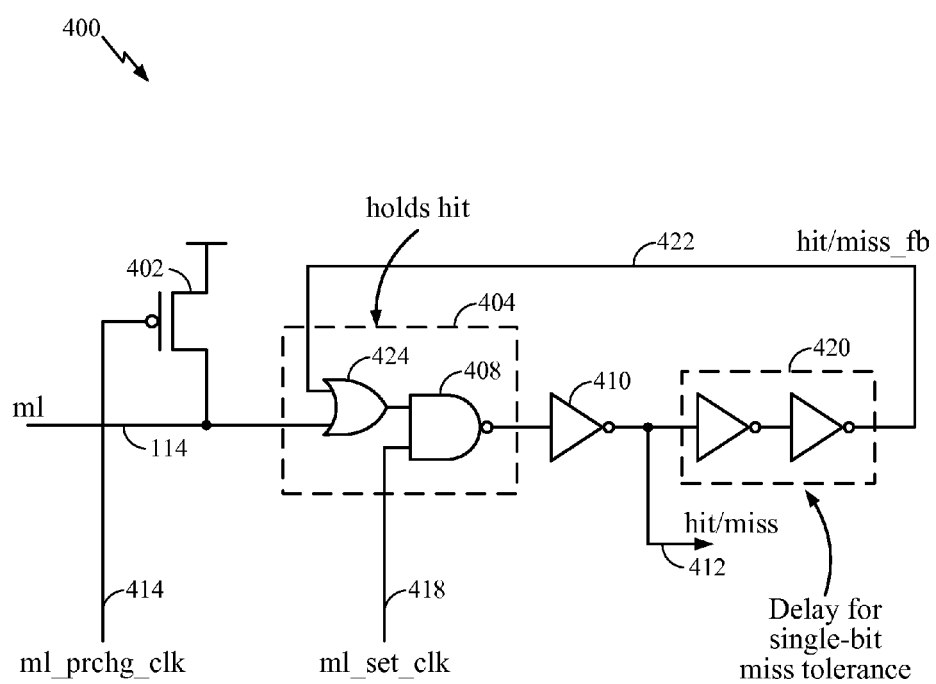
FIG. 4A illustrates a matchline receiver according to an exemplary aspect.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects of this disclosure pertain to a matchline retention circuit for a matchline of a content addressable memory (CAM). The matchline retention circuit is configured to mitigate the aforementioned problems associated with search and write conflicts for a row of the CAM associated with the matchline. In one or more aspects, during a first clock phase, a state of the matchline may be "high" or "low," depending on whether a search for a first data word on the row produced a hit or a miss, respectively. If there is a simultaneous write operation, for example, for a second data word, during the first clock phase, then the matchline retention circuit retains the state of the matchline based on the search operation.

In more detail, if the search produces a hit during the first clock phase for the first data word, but the write operation of the second data word may cause a miss, the matchline retention circuit includes a hit retention circuit to retain the hit state of the matchline for at least the duration of the first clock phase. On the other hand, if the search produces a miss during the first clock phase for the first data word, the matchline retention circuit includes a miss retention circuit to maintain the miss state of the matchline for at least the duration of the first clock phase. Thus, the miss retention circuit prevents the matchline from floating if the write of the second data word were to match the searched first data word. In some aspects, the output of the matchline retention circuit may indicate a miss during a second clock phase, and the matchline is precharged during the second clock phase.

In exemplary aspects, the matchline retention circuit may be provided within a matchline receiver for the row. A CAM array may have several rows of CAM cells with a matchline retention circuit provided for each row. A conventional matchline receiver for a CAM array will first be described with reference to FIGS. 1-3, in order to provide background information which will be useful in understanding the operation of exemplary aspects described in later sections.

Accordingly, with reference to FIG. 1, a conventional CAM cell 100 is illustrated. CAM cell 100 includes storage element 102 and compare circuit 104. Storage element 102 is shown as a conventional 6 transistor (6T) static random access memory (SRAM) with cross-coupled inverters 108a and 108b coupled through pass gates 110a and 110b to complementary write bitlines wbl 112a and wblb 112b, respectively. Pass gates 110a and 110b are enabled when write wordline wwl 106 is selected or set to a high state. A data bit may be written or stored in storage element 102 through complementary write bitlines wbl 112a and wblb 112b when write wordline wwl 106 is high.

During a search operation, the stored data bit in storage element 102 is compared, in compare circuit 104, to a search data bit carried on complementary search lines clc 116a and clt 116b. Matchline 114 is precharged to a high state. If the search data bit matches the stored data bit, matchline 114 remains high. If the search data bit does not match the stored data bit, then matchline 114 is pulled down to a low state. As further explained below, matchline 114 is shared between multiple CAM cells in a row, which means that if there is a mismatch between the search data bit and the stored data bit in a single CAM cell in the row, matchline 114 is pulled down to indicate that the searched data was not found in the row and there was a miss. Conversely, all of the search data bits must match the corresponding stored data bits in a row for matchline 114 to stay high, indicating a hit.

With reference now to FIG. 2, a conventional CAM array 200 is illustrated with multiple CAM cells such as CAM 100, arranged in rows and columns Wordline drivers are used to activate selected rows of CAM array 200 and matchline receivers are used to receive/capture the state of matchlines for each row. For example, considering row 208 which has been identified in FIG. 2, write wordline (wwl) driver 202 of row 208 drives the write wordline wwl of each CAM cell in row 208 (e.g., write wordline 106 of CAM cell 100). Each column of CAM array has a write bitline and a search line driver to supply the data bit to be written and/or a search data bit to be compared with the stored data bits. As shown, for column 210, write bitline (wbl) driver 204 supplies complementary write bitlines wbl 112a and wblb 112b for a write operation and search line (cl) driver 205 supplies complementary search lines clc 116a and clt 116b for a search operation for CAM cells such as CAM cell 100 in column 210.

CAM cell 100, which is in the intersection of row 208 and column 210, may be selected by write wordline driver 208 during a particular clock cycle for a write operation. If the operation to be performed is a search, then search line driver 205 provides the search data bit on complementary search lines clc 116a and clt 116b to be compared with the data bit stored in CAM cell 100. Similarly, all CAM cells in row 208 are supplied with search data bits from respective write bitline/search line drivers. Matchline (ml) receiver 206 obtains the hit/miss indication based on whether matchline 114 (shown in FIG. 1) remains at its precharged high/hit state due to all stored data bits in row 208 matching with all searched bits, or is pulled down to a low/miss state due to at least one bit mismatch.

With reference now to FIG. 3, a detailed view of conventional matchline receiver 206 is provided. Three signals, ml_prchg_clk 314, ml_keep_clk 316, and ml_set_clk 318 are used to control the phases of operation of matchline receiver 206, during a clock cycle in which matchline 114 is received and hit/miss 312 is provided as an output of CAM array 200, for example. As mentioned, matchline 114 is initially precharged to a high state during the start of an operation, and is either pulled down if there is a miss or remains high if there is a hit. Thus, matchline 114 is pulled up to a precharged/high state towards the end of a previous clock cycle (e.g., in a second clock phase of the previous clock cycle) in order to enter a current clock cycle under consideration (e.g., in a first clock phase of the current clock cycle) in a precharged/high state. A pattern of precharging matchline 114 in the second clock phase of each clock cycle is followed so that matchline 114 enters the first clock phase of a following clock cycle in a high state.

Precharge of matchline 114 in this manner is controlled by the precharge signal, ml_prchg_clk 314, which is driven low, for example, in the second clock phase (e.g., of a previous clock cycle) in order to cause p-channel metal oxide semiconductor (PMOS) transistor 302 to be turned on and drive matchline 114 to positive supply voltage (e.g., "Vdd") in the second clock phase. At the first clock phase (e.g., of a current clock cycle), ml_prchg_clk 314 is driven high, which causes PMOS transistor 302 to be turned off, cutting off the precharge path to matchline 114. From here on the state of matchline 114 in the first clock cycle will depend on whether there is a hit or a miss. Alternative implementations are also possible where matchline 114 can be precharged at the beginning of the first clock phase in each clock cycle, wherein ml_prchg_clk 314 can be driven low during the first clock phase and then either driven high later in the first clock phase or driven high in the second clock phase. However, such alternatives for precharging matchline 114 may impact the performance/speed of operation because matchline 114 will be driven high during the start of each clock cycle, rather than entering the clock cycle in a precharged state as per the above-described implementation where ml_prchg_clk 314 is driven high during the first clock phase and then driven low in the second clock phase.

A search operation will now be explained in further detail. During the first clock phase of a system clock, the system clock goes high, followed by ml_prchg_clk 314 being driven high (turning precharging of matchline 114 off). Next, (or in parallel) complementary search lines clc 116a and clt 116b are driven (e.g., by search line (Cl) driver 205), followed by ml_set_clk 318 being driven high. While ml_prchg_clk 314 and complementary search lines clc 116a and clt 116b are driven as fast as possible after the system clock goes high, driving ml_set_clk 318 can take place after a delay, which corresponds to the slowest discharge of matchline 114 (e.g., corresponding to a single-bit miss). The delay following driving of complementary search lines clc 116a and clt 116b, after which ml_set_clk 318 is driven, can be generated with logic to mimic the slowest discharge of matchline 114 or some other suitable delay circuitry. Because of this delay on ml_set_clk 318, the output of NAND gate 308 goes low only in case there is a hit on matchline 114, causing hit/miss 312 to be driven high to indicate a hit. If there is a miss, the output of NAND gate 308 does not switch, but stays high, causing hit/miss 312 to be low to indicate a miss.

The signal, ml_keep_clk 316 is an active low signal and is activated or driven low in the first clock phase after ml_set_clk 318 is driven high, with another delay. The delay on ml_keep_clk 316 after ml_set_clk 318 is driven high is to ensure that driving ml_keep_clk 316 low does not interfere with the discharge of matchline 114 in case there is a miss, and also to ensure that if there is a hit, matchline 114 can be reliably held high.

In the second clock phase, the system clock goes low, following which ml_set_clk 318 goes low. Next, complementary search lines clc 116a and clt 116b are deactivated. In the second clock phase, ml_keep_clk 316 can be deactivated (driven high) any time after ml_set_clk 318 goes low. Finally, ml_prchg_clk 314 goes low, which starts precharging matchline 114 for the following clock cycle of the system clock.

However, it is possible that a write operation can be performed on row 208 during the same clock cycle that a search operation is performed. For example, write data may be supplied via complementary write bitlines wbl 112a and wblb 112b by write bitline (wbl) driver 204, wherein the write data may not match the search data driven on complementary search lines clc 116a and clt 116b. Thus, even though after being precharged, matchline 114 would have stayed high if not for the write operation, matchline 114 may incorrectly be driven low due to the write operation, thus causing the output of NAND gate 308 to be driven high and turning off PMOS transistor 304. By the time ml_keep_clk 316 is activated or driven low in the first clock phase, PMOS transistor 304 may already be off and ml_keep_clk 316 will not impact the state of matchline 114. Thus, the signal hit/miss 312 would be low, indicating a miss. If, on the other hand, matchline 114 had been pulled low after precharge based on the search, the output of NAND gate 308 would be high, causing PMOS transistor 304 to be turned off; which means that a conflicting write operation which matches the search data can cause matchline 114 to float and hit/miss 312 to go to an unknown or floating state because PMOS transistor 304 would be off. Thus, there is a need to retain hit/miss 312 at the correct value based on the search operation and prevent a conflicting write operation from corrupting the hit/miss indication.

With reference to FIG. 4A, an exemplary aspect of matchline receiver 400 is illustrated. Matchline receiver 400 is also configured to receive matchline 114 as an input (e.g., of content-addressable memory (CAM) array 200), wherein matchline 114 is configured to provide a hit/miss indication for a search operation of a data word (e.g., in row 208, of CAM array 200). Matchline receiver 400 comprises a retention circuit configured to provide a hit/miss output shown as hit/miss 412, wherein hit/miss 412 is configured to retain the hit/miss indication provided by matchline 114 (e.g., during a first clock phase of a clock), even if matchline 114 is modified during the first clock phase. More specifically, as shown in FIG. 4A, matchline receiver 400 comprises a hit retention circuitry configured to retain, on hit/miss 412, a hit indication provided by matchline 114. The hit retention circuit comprises or-and-invert (OAI) logic 404, with one input of OAI logic 404 derived from a feedback path from hit/miss 412 and another input of OAI logic 404 provided by matchline 114. The feedback path from hit/miss 412 is shown to comprise delay circuit 420, which provides a delayed version of hit/miss 412 to OAI logic 404. Reasons for including delay circuit 420 in an example implementation of matchline receiver 400 will be explained in detail with reference to FIG. 4B below. However, it will be understood that delay circuit 420 is an optional feature which may be omitted in some implementations of matchline receiver 400, wherein hit/miss 412 can be directly fed back as an input to OAI logic 404 (without being passed through a delay).

Operation of matchline receiver 400 in FIG. 4A will now be described with reference to a current clock cycle under consideration and a previous clock cycle of a system clock. As previously described, matchline 114 is precharged to a high state in a second clock phase of the previous clock cycle, such that matchline 114 enters the first clock phase of the current clock cycle in a precharged state. The precharge is turned off during the first clock phase of the current clock cycle, and depending on whether a search operation produces a hit or miss, matchline 114 remains at the precharged phase or is pulled down, respectively. Accordingly, PMOS transistor 402 is turned on to precharge matchline 114 during the second clock phase of the previous clock cycle by the precharge signal ml_prchg_clk 414 going low, and in the first clock phase of the current clock cycle, ml_prchg_clk 414 goes high, turning off PMOS transistor 402, causing matchline to remain high or fall based on whether there was a hit or miss, respectively, in CAM array 200.

For each clock cycle (e.g., of the system clock used in the operation of matchline receiver 400), the first clock phase may be a high clock phase where the clock is high and the second clock phase may be a low clock phase where the clock is low. As will be explained in the following sections, matchline receiver 400 is configured to retain a hit indication on matchline 114 from a search operation during the first clock phase and prevent the hit indication from being corrupted by a conflicting write operation during the first clock phase. In the second clock phase, matchline 114 is precharged again, and the output of matchline receiver 400, i.e., hit/miss 412, is pulled down to a low state (i.e., set to a miss state) when ml_set_clk 418 goes low.

To further explain the features of matchline receiver 400, the case where a search operation results in a hit (e.g., on row 208 of FIG. 2, which is received by matchline receiver 400) will be considered first. With matchline 114 precharged to a high or hit state at the beginning of the first clock phase of the current clock cycle, matchline 114 remains high due to the hit, and thus, OAI logic 404 is provided with a high input from matchline 114. As shown, OAI logic comprises OR gate 424 and NAND gate 408. OR gate 424 transfers the high input from matchline 114 to NAND gate 408. Once the signal, ml_set_clk 418 goes high, the output of NAND gate 408 (i.e., the output of OAI logic 404) goes low, gets inverted by inverter 410, and appears as a high state on the signal hit/miss 412. As previously explained, it is important to prevent hit/miss 412 from being corrupted by a conflicting write operation in the first clock phase while ml_set_clk 418 is high. In order to ensure this, a delayed version of hit/miss 412 is provided by delay circuit 420, whose output, hit/miss_fb 422 is fed back to OAI logic 404. As seen, hit/miss_fb 422 comprises a feedback path, which feeds a high input to OR gate 424 of OAI logic 404. Thus, even if matchline 414 were to be pulled down due to a miss caused by a conflicting write operation, at least one input (from hit/miss_fb 422) of OR gate 424 will be high, causing the output of NAND gate 408 to remain low and hit/miss 412 to be retained at a high state, while ml_set_clk 418 is high. Therefore, the delayed version of hit/miss 412 provided by hit/miss_fb 422 holds the hit indication provided by matchline 114 even if hit/miss 412 changes. In the second clock phase, ml_set_clk 418 falls, which causes hit/miss 412 to be pulled to a low or miss state, as mentioned previously.

Figure 4B:
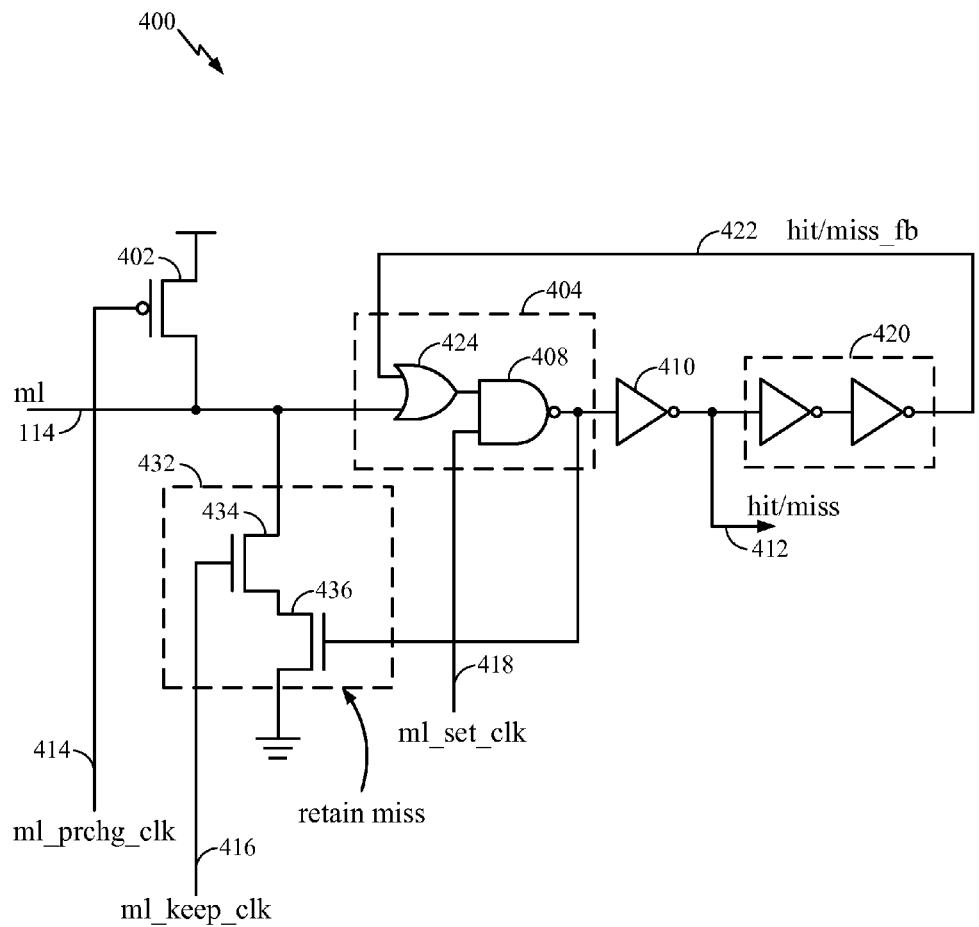
FIG. 4B illustrates a matchline receiver according to another exemplary aspect.

With reference now to FIG. 4B, another exemplary aspect of matchline receiver 400 is illustrated. In addition to the aspects of matchline receiver 400 shown and described with reference to FIG. 4A, the illustration in FIG. 4B further includes matchline retention circuitry comprising miss retention circuitry. The miss retention circuit is configured to retain a miss indication provided by matchline 114 on hit/miss 412.

The miss retention circuit comprises pull-down transistors to hold matchline 114 in a low or miss state during a given time period (e.g., the first clock phase of a clock cycle under consideration) such that hit/miss 412 is not disturbed during that time period. For example, the miss retention circuitry includes a keeper stack 432 comprising pull-down transistors: n-channel metal oxide semiconductor (NMOS) transistors or n-channel field effect transistors (NFETs) 434 and 436. Keeper stack 432 comprising the pull-down transistors or NFETs 434 and 436 is used for retaining a miss indication on matchline 114 from a search operation, for example on row 208 during the first clock phase of a clock cycle under consideration, and to prevent this miss indication from being corrupted by a conflicting write operation in the first clock phase. In the second clock phase, matchline 114 is once again driven high to be precharged for a search operation in the following clock, and hit/miss 412 is pulled down to a low state or miss indication.

In more detail, matchline 114 enters the first clock phase in a precharged state based on precharge signal ml_prchg_clk 414 being low and PMOS transistor 402 being turned on. Following this, ml_prchg_clk 414 is driven high and PMOS transistor 402 is turned off. If there is a miss due to the search operation, then matchline 114 falls to a miss state. Similar to the case of matchline receiver 206, ml_set_clk 418 is activated or driven high after a first delay after ml_prchg_clk 414 is driven high. Alternatively, ml_set_clk 418 may be activated after complementary search lines clc 116a and clt 116b are activated (e.g., search line clt 116b is driven high and clc 116a is driven low in the first clock phase when search data is "1", and the complementary search lines are deactivated in the second clock phase by driving both complementary search lines clc 116a and clt 116b low; similarly, for a search data "0", search line clt 116b is driven low and clc 116a is driven high in the first clock phase, and both complementary search lines clc 116a and clt 116b are driven low or deactivated in the second clock phase). The first delay is introduced in order to mimic the delay of a single-bit mismatch.

At the beginning of the first clock phase, when ml_set_clk 418 is still low, the output of OAI logic 404 is high and hit/miss 412 is low. The output of OAI logic 404 goes low and hit/miss 412 goes high only in case of a hit on matchline 114 after ml_set_clk 418 goes high.

In the case of a miss on matchline 114, the output of OAI logic 404 remains high and hit/miss 412 remains low even after ml_set_clk 418 goes high. NFET 436 of keeper stack 432 is turned on when the output of OAI logic 404 is high. The signal, ml_keep_clk 416 is driven high after a second delay after ml_set_clk 414 is driven high. When ml_keep_clk 416 is also high, NFET 434 of the keeper stack 432 is also turned on, thus, holding matchline 114 down to retain a miss state. The second delay is long enough to ensure that ml_keep_clk 416 does not accidently (unintentionally) pull down a hit on matchline 114, but at the same time, the second delay is also short enough to ensure that matchline 114 is reliably held in a low state in case there is a miss. Therefore, a conflicting write during the first clock phase will not be able to pull up matchline 114 during the first clock phase, nor will a conflicting write cause hit/miss 412 to float.

As previously described with reference to FIG. 4A, some implementations of matchline receiver 400 can include delay circuit 420. Aspects related to delay circuit 420 will now be explained in further detail. As mentioned previously, the rising edge of ml_set_clk 418 is delayed (i.e., the first delay) from the rising edge of ml_prchg_clk 414 (and/or after complementary search lines clc 116a and clt 116b chicle activation), where the first delay is introduced to ensure that in the case of a miss, matchline 114 has discharged to an adequate level to be detected as a miss (corresponding to the time taken for matchline 114 to fall in the case of a single bit miss, for example). However process variations can cause ml_set_clk 418 to be activated or driven high earlier or cause a miss on matchline 114 to take a longer time to discharge. The signal, ml_set_clk 418 can accordingly be delayed even more than the aforementioned first delay, in order to fully account for such process variations and deviations from expected behavior. However, delaying the rise of ml_set_clk 418 can impact performance. Therefore, delay circuit 420 can be provided in example implementations of matchline receiver 400, to delay the capture of a hit by OAI logic 404, thereby allowing matchline 114 to further discharge in the case of a miss. In this manner, delay circuit 420 can add more tolerance for a single-bit mismatch and improve performance (because the first delay on ml_set_clk 418 can be small).

With reference to FIG. 4C, a timing diagram 450 of the above-described signals related to matchline receiver 400 in FIGS. 4A-B is illustrated. System clock 452 provides the clock for operating matchline receiver 400. A first clock and a second clock cycle of system clock 452 are shown, each with respective first and second clock phases. Where the first clock cycle is a current clock cycle under consideration, the case of a search operation resulting in a hit is shown. Where the second clock cycle is the clock cycle under consideration, the case of a miss is illustrated.

Proceeding with a detailed explanation of the timeline with combined reference to FIGS. 4A-C, as well as CAM cell 100 of FIG. 1 and CAM array 200 of FIG. 2, when system clock 452 goes high during the first clock phase of the first clock cycle (at time t1), matchline 114 is precharged and precharge signal ml_prchg_clk 414 is active low. At time t2, precharge signal ml_prchg_clk 414 is deactivated or driven high, turning off PMOS transistor 402, and ending the precharge phase. At time t3, complementary search lines clc 116a and clt 116b (FIGS. 1-2) are driven and the corresponding search data is compared with data stored (e.g., in row 208). As mentioned, the first clock cycle illustrates the case where there is a hit, which means matchline 114 remains at the precharged high state after time t3. After the aforementioned first delay following time t3, at time t4, ml_set_clk 418 is driven high, and after the second delay following time t4, ml_keep_clk 416 is driven high at time t5. At time t6, hit/miss 412 goes high and after passing through delay circuit 420, hit/miss_fb 422 goes high at time t7. If write wordline wwl 106 fires or goes high, indicating a write operation any time after hit/miss_fb 422 goes high, then hit retention logic prevents hit/miss 412 from being corrupted. Specifically, as seen, hit/miss 412 remains high until time t12, even though hit/miss_fb 422 does not fall until a later time t13. The write wordline wwl 106 can fall at time t13 or any later time, as long as the write operation is completed before ml_prchg_clk 414 is turned off in the subsequent, second clock cycle.

Proceeding to the second clock phase of the first clock cycle, at time t8, system clock 452 falls. At time t9, ml_prchg_clk 414 is driven active low again, in order to precharge matchline 414 for the second clock cycle. At time t10, the complementary search lines clc 116a/clt 116b also fall/are deactivated, since the search operation is complete at this time. Correspondingly, ml_set_clk also falls at time t11 and hit/miss 412 is pulled down during the second clock phase, at time t12. The time t9 at which ml_prchg_clk 414 is driven low may be designed to be later than time t11 at which ml_set_clk 418 goes low and also after time t10 at which complementary search lines clt 116a/clc 116b are deactivated. Correspondingly, hit/miss_fb 422 also falls after the delay introduced by delay circuit 420, at time t13.

The second clock cycle where the search operation results in a miss will now be considered. Similar behavior of signals already discussed with reference to the first clock cycle will not be repeated, for the sake of brevity, but the discussion herein will focus on relevant differences. For example, at time t14, the complementary search lines clc 116a/clt 116b are driven, indicating a search operation, which results in a mismatch or miss indication on matchline 114 at time t15. Hit/miss 412 and hit/miss_fb 422 remain low to indicate a miss. Once again, ml_set_clk 418 goes high during the first clock phase of the second clock cycle after the first delay, at time t16 and ml_keep_clk goes high at time t17, after the second delay. Write wordline wwl 106 can go high, indicating a conflicting write after ml_keep_clk 416 goes high at time t17. However, hit/miss 412 and hit/miss_fb 422 are not affected by this as they are maintained at their low states by miss retention circuitry of FIG. 4B comprising keeper stack 432. The signals hit/miss 412 and hit/miss_fb 422 remain low in the second clock phase of the second clock cycle as well, and at time t18, precharge signal ml_prchg_clk 414 is driven low and matchline 114 is precharged to a high state at time t19 in preparation for the next clock cycle.

Figure 5:
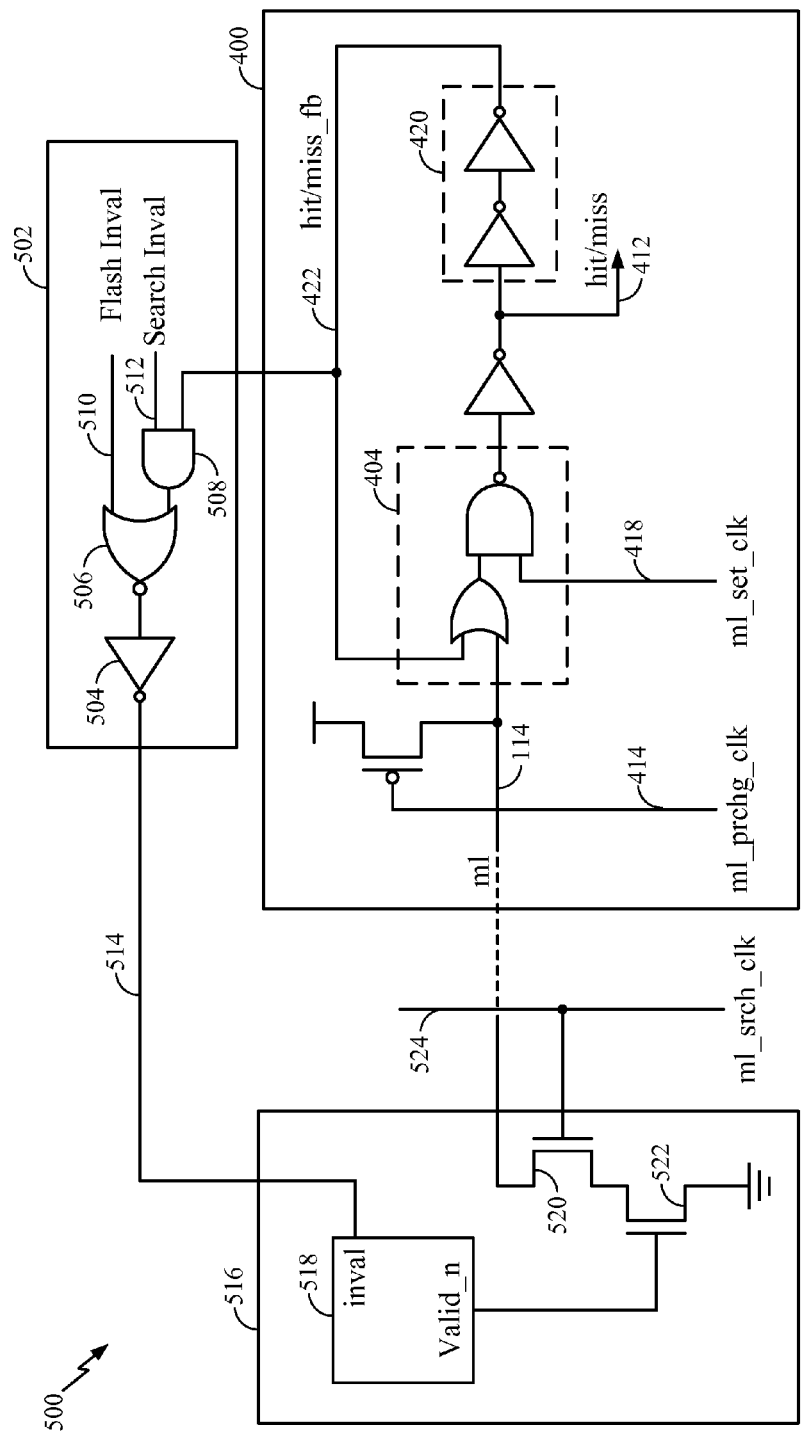
FIG. 5 illustrates a matchline receiver deployed in a search and invalidate operation, according to an exemplary aspect.

With reference now to FIG. 5, circuit 500 is illustrated, with logic related to search and invalidation added to matchline receiver 400 of FIGS. 4A-B. Circuit 500 and is deployed, for example, in search and invalidate operations. Details of matchline receiver 400 will not be repeated, but this discussion will focus on cooperation of invalidation logic 502 and valid logic 516 with matchline receiver 400. Invalidation logic 502 is used to invalidate a valid indication in valid logic 516 (e.g., an indication of whether the data word corresponding to matchline 114, e.g., row 208 of FIG. 2, includes valid data), without impacting the hit/miss indication on matchline 114.

Accordingly, invalidation logic 502 has inputs: search invalidate 512, flash invalidate 510, and hit/miss_fb 422 from matchline receiver 400. Flash invalidate 510 is used to invalidate all entries of CAM array 200, for example, by invalidating valid bits. Search invalidate 512 is used to invalidate a data word if the data word is found in CAM array 200. In other words, search invalidate 512 invalidates the valid indication of row 208 if row 208 generates a hit indication on matchline 114. Therefore, if hit/miss_fb 422 and search invalidate 512 are high (based on AND gate 508) or flash invalidate 510 is high, output of NOR gate 506 is low. After passing through inverter 504, if output invalidate signal 514 of invalidation logic 502 is high, it means an invalidation of valid logic 516 is to be performed. However, care must be taken to ensure that the invalidation does not corrupt the original hit indication on hit/miss 412, for example, in a search and invalidate operation when search invalidate 512 is asserted. This is similar to the problem faced by a write conflict potentially corrupting a hit indication.

Valid logic 516 includes valid cell 518, which stores an indication of whether row 208 has valid data (e.g., an indication whether the data stored in row 208 pertains to the latest/correct information). In case invalidate signal 514 is high, then the valid indication in valid cell 518 must be cleared. This would mean that valid_n, which is a complement of the valid bit would be driven high. Pull-down transistor 522 (e.g., an NMOS transistor or NFET), which is coupled to valid_n would be turned on when valid_n goes high.

The signal. ml_srch_clk 524 has the same timing as that of complementary search lines clc 116a and clt 116b. So, ml_srch_clk 524 is low during the beginning of the first clock phase of a clock cycle under consideration and then goes high at the same time as, or a short time after, ml_prchg_clk 414 goes high in the first clock phase (and in the second clock phase, ml_srch_clk 524 falls at the same time complementary search lines clc 116a and clt 116b are deasserted). Thus, while the signal, ml_srch_clk 524 is high in the first clock phase, NMOS transistor 520 is also turned on. Once valid cell 518 has been invalidated as noted above (by valid_n going high following search invalidate 512 going high), both NMOS transistors 520 and 522 will be turned on, and thus, they pull matchline 114 down. However, hit retention circuitry comprising OAI logic 404 would have already captured a hit on hit/miss 412 when hit/miss_fb 422 was driven high. Therefore, the output of the hit retention circuit, hit/miss 412, does not get corrupted by the invalidation of the associated valid cell 518.

Figure 6A:
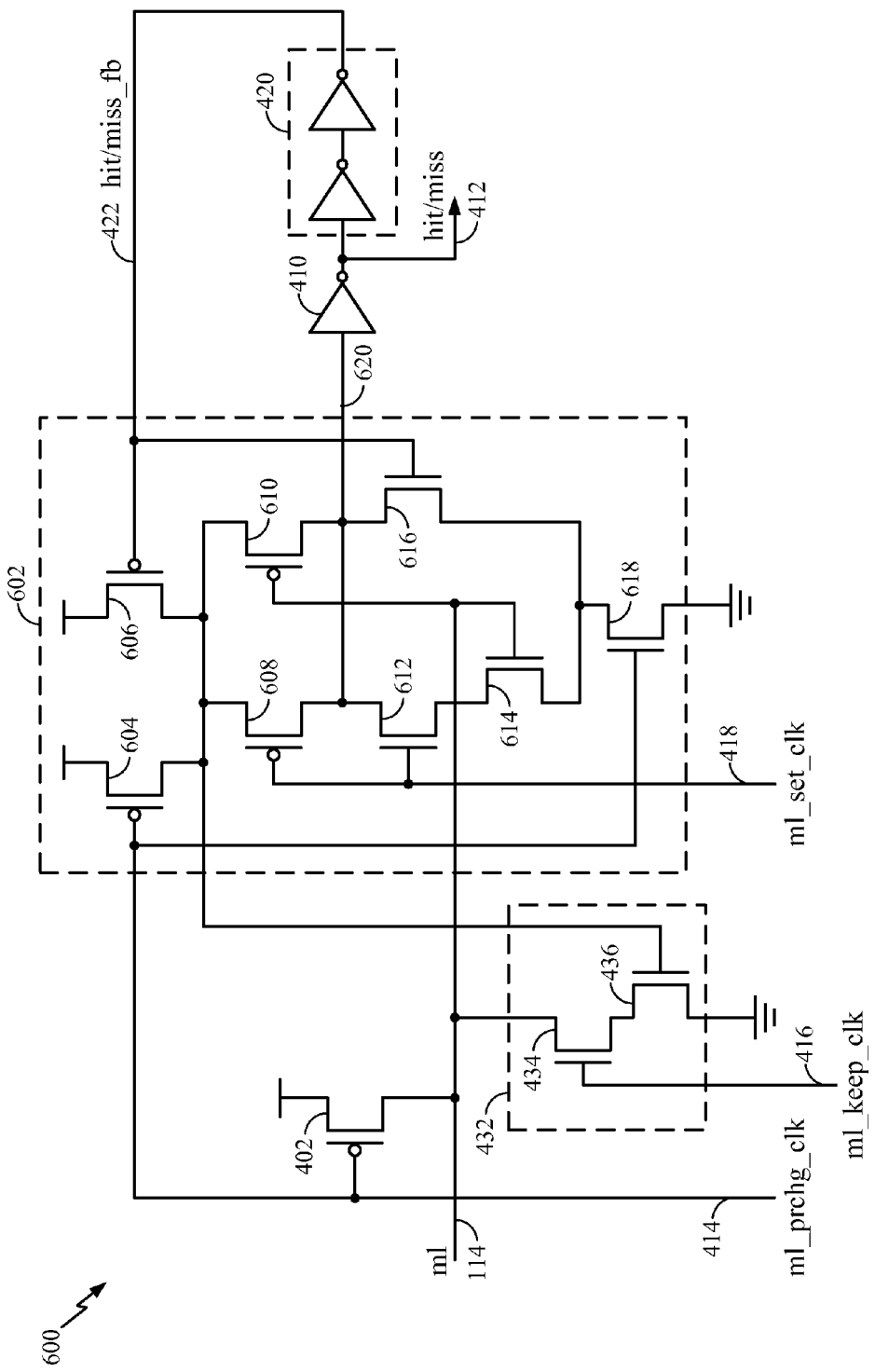
FIG. 6A illustrates a matchline receiver according to another exemplary aspect.

With reference now to FIG. 6A, matchline receiver 600 is illustrated, which is an alternative implementation of matchline receiver 400 of FIG. 4B. Like reference numerals have been retained for identifying similar aspects between matchline receivers 400 and 600. Logic 602 of matchline receiver 600 replaces OAI logic 404 of matchline receiver 400.

When ml_prchg_clk 414 goes high (precharge turns off) in the first clock phase, PMOS transistor 604 turns off and NMOS transistor 618 turns on. In the case of a hit, matchline 114 remains high after precharge, keeping NMOS transistor 614 on. When ml_set_clk 418 goes high after the aforementioned first delay, NMOS transistor 612 turns on and the combination of NMOS transistors 612, 614, and 618 drive output 620 of logic 602 to a low state, causing the hit/miss 412 to go high after passing through inverter 410. Subsequently the signal hit/miss_fb 422 goes high, after delay caused by delay circuit 420, and turns on NMOS transistor 616. Once NMOS transistor 616 turns on, the combination of NMOS transistors 616 and 618 will hold hit/miss 412 in high state as long as NMOS transistor 618 is on, independent of the state of NMOS transistors 612 and 614. In other words, after hit/miss_fb 422 goes high, hit/miss 412 continues to stay high while ml_prchg_clk 414 stays high, independent of the state of ml_set_clk 418 and matchline 114.

Then, in the second clock phase, when ml_prchg_clk 414 and ml_set_clk 418 both go low, PMOS transistors 604 and 608 turn on and drive output 620 of logic 602 to a high state, causing hit/miss 412 to go to a low or miss state. In this manner, logic 602 allows the falling or trailing edge of the hit/miss 412 to be controlled by the combination of ml_set_clk 418 and ml_prchg_clk 414. The falling edge of ml_prchg_clk 414 may occur after the falling edge of ml_set_clk 418. Therefore, logic 602 will retain the hit indication on hit/miss 412. This is shown in the timing diagram of FIG. 6B. Furthermore, the delay between the falling edge of ml_set_clk 418 and the falling edge of ml_prchg_clk 414 can be increased to further prolong the retention of the hit indication of hit/miss 412.

Figure 6B:
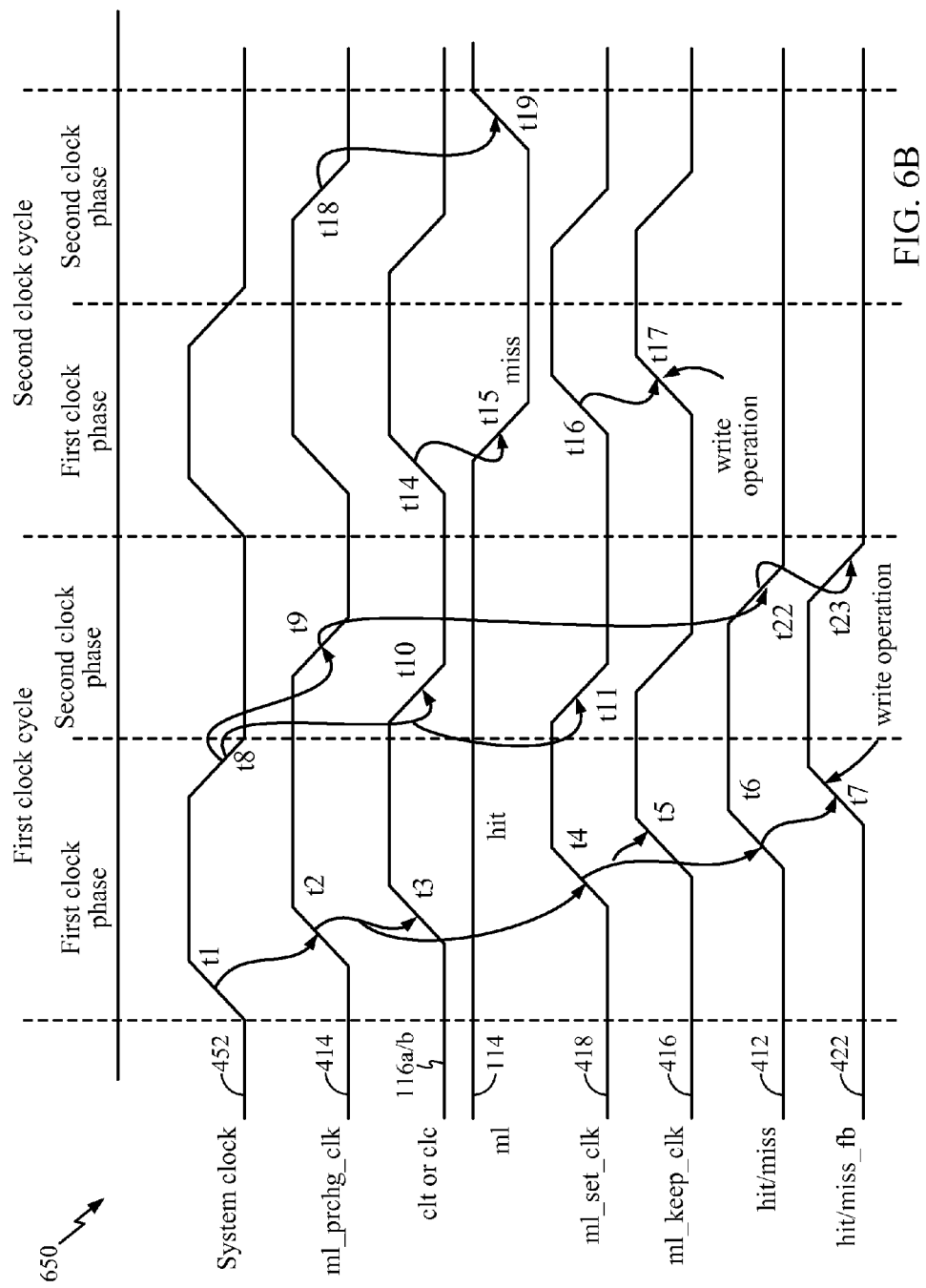
FIG. 6B illustrates a timing diagram corresponding to the matchline receiver of FIG. 6A.

Referring to FIG. 6B, timing diagram 650 for matchline receiver 600 is illustrated. Once again, timing diagram 650 is similar to timing diagram 450 of FIG. 4C in several aspects and as such, like reference numerals have been retained and explanation of similar aspects will not be repeated. Focusing on the differences, the falling edges of hit/miss 412 and hit/miss_fb 422 are delayed with respect to times t12 and t13 of FIG. 4C, to times t22 and t23 in FIG. 6B. This is because the trailing edge of hit/miss 412 at time t22 is based on the trailing edge of ml_prchg_clk at time t9, as discussed above. Thus, the duration for which hit/miss 412 and hit/miss_fb 422 are retained at the high state are accordingly longer in comparison to FIG. 4C. The longer retention provides a greater duration for which the hit signal can be retained without being potentially corrupted by a conflicting write operation.

Figure 7:
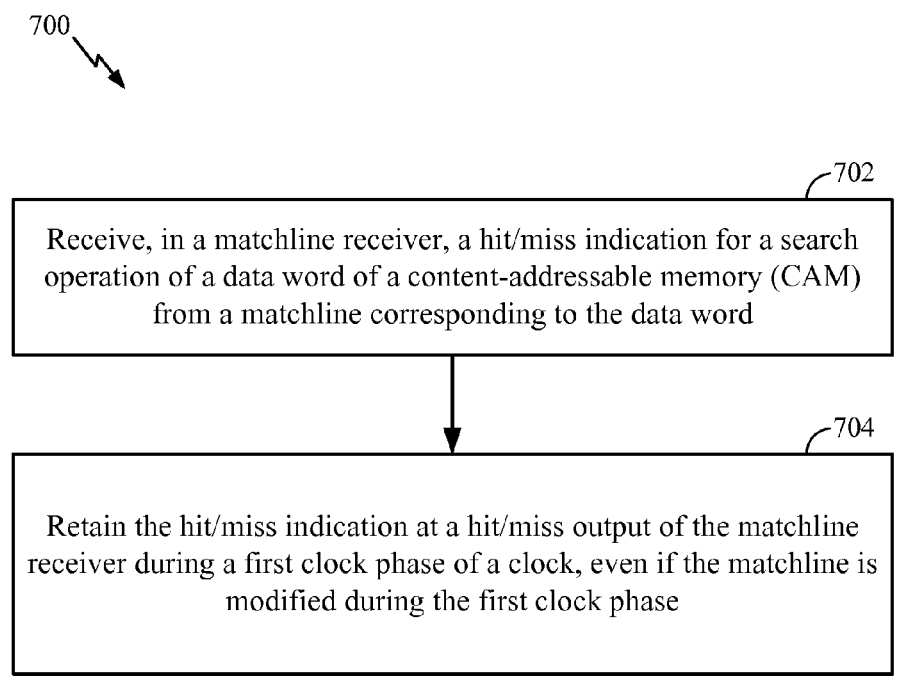
FIG. 7 is a flow chart representation of a method of retaining matchline indication according to an exemplary aspect.

It will be appreciated that exemplary aspects include various methods for performing the processes, functions and/or algorithms disclosed herein. For example, as shown in FIG. 7, an exemplary aspect includes method 700 of operating a matchline receiver (e.g., matchline receiver 400).

Accordingly, in Block 702, method 700 includes receiving a hit/miss indication for a search operation of a data word of a content-addressable memory (CAM) from a matchline corresponding to the data word. For example, Block 702 relates to receiving a hit/miss indication for a search operation of a data word in row 208 of CAM 200 from matchline 114.

Block 704 includes retaining the hit/miss indication at a hit/miss output of the matchline receiver during a first clock phase of a clock, even if the matchline is modified during the first clock phase. For example, Block 704 relates to hit/miss indications on matchline 114 being retained at output, hit/miss 412, of matchline receiver 400. With reference to FIGS. 4A-B the hit retention circuit comprising OAI logic 404 and delay circuit 420 provides a feedback path to retain a hit indication of matchline 114, and the miss retention circuit comprising keeper stack 432 (comprising pull-down transistors) retains a miss indication on matchline 114 (e.g., during the first clock phase of system clock 452 as shown in FIG. 4C). The hit retention circuitry prevents a conflicting write operation during the first clock phase from being able to pull down hit/miss 412. The miss retention circuitry prevents a conflicting write operation during the first clock phase from being able to pull up matchline 114 or cause hit/miss 412 to float. Similarly, other operations such as search and invalidate operations are also prevented from being able to modify the hit/miss indications as described with reference to FIG. 5 above.

Figure 8:
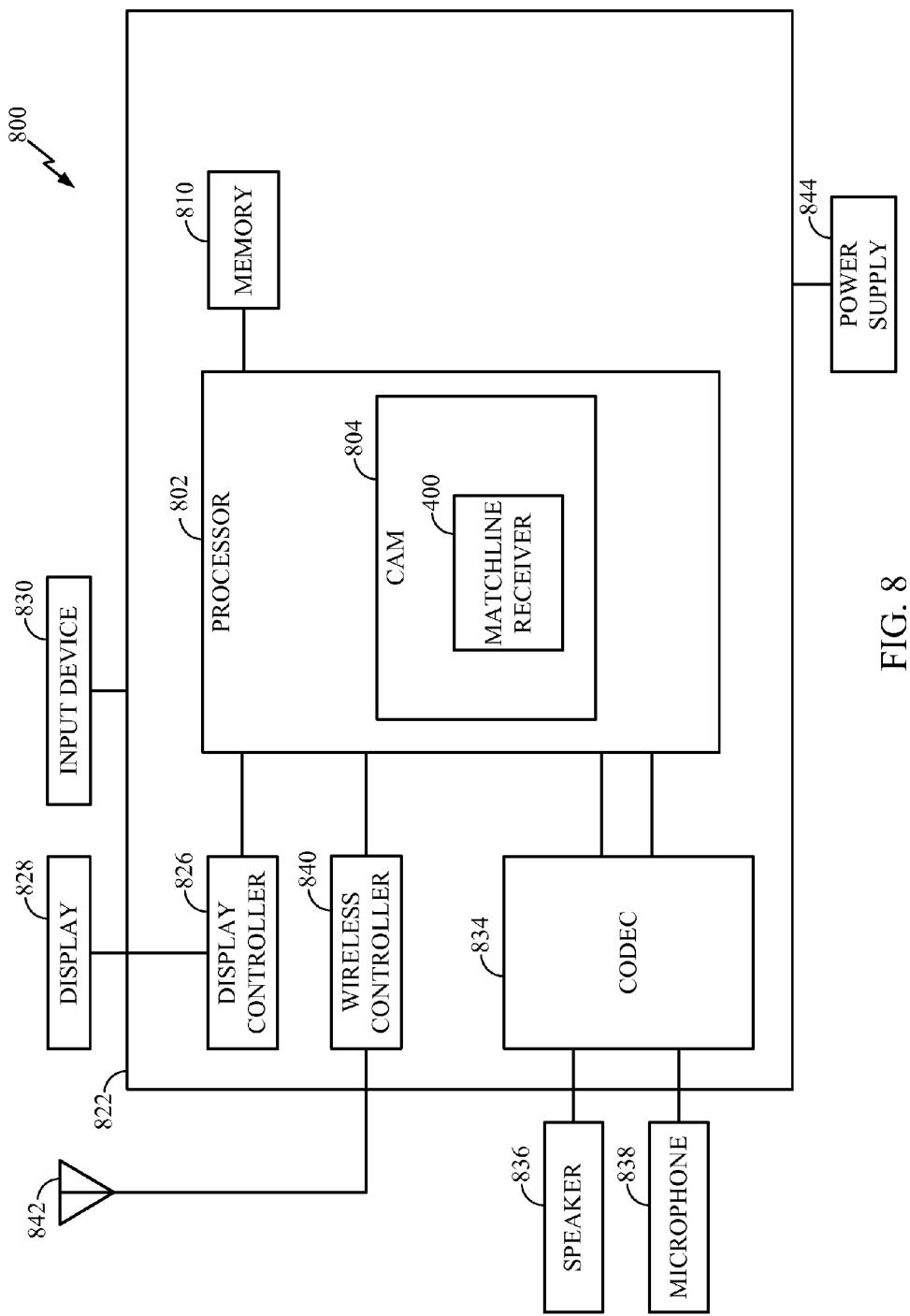
FIG. 8 illustrates an exemplary processing device in which an aspect of the disclosure may be advantageously employed.

An example apparatus in which an exemplary matchline receiver (e.g., 400 or 600) may be deployed will now be discussed in relation to FIG. 8. FIG. 8 shows a block diagram of processing device 800 that is configured according to exemplary aspects. Processing device 800 may be a computing device in some aspects and may be configured to implement method 700 of FIG. 7. As shown, processing device 800 includes processor 802 communicatively coupled to memory 810. In the illustrated example, processor 802 may include CAM array 804 (which may be similar in some aspects to CAM array 200 described with reference to FIG. 2), wherein CAM array 804 comprises matchline receiver 400 configured according to exemplary aspects.

FIG. 8 also shows display controller 826 that is coupled to processor 802 and to display 828. Coder/decoder (CODEC) 834 (e.g., an audio and/or voice CODEC) can be coupled to processor 802. Other components, such as wireless controller 840 (which may include a modem) are also illustrated. Speaker 836 and microphone 838 can be coupled to CODEC 834. FIG. 8 also indicates that wireless controller 840 can be coupled to wireless antenna 842. In a particular aspect, processor 802, display controller 826, memory 810, CODEC 834, and wireless controller 840 are included in a system-in-package or system-on-chip device 822.

In a particular aspect, input device 830 and power supply 844 are coupled to the system-on-chip device 822. Moreover, in a particular aspect, as illustrated in FIG. 8, display 828, input device 830, speaker 836, microphone 838, wireless antenna 842, and power supply 844 are external to the system-on-chip device 822. However, each of display 828, input device 830, speaker 836, microphone 838, wireless antenna 842, and power supply 844 can be coupled to a component of the system-on-chip device 822, such as an interface or a controller.

It should be noted that aspects of processing device 800 of FIG. 8, e.g., processor 802 and memory 810, may also be integrated into a set-top box, a music player, a video player, an entertainment unit, a navigation device, a personal digital assistant (PDA), a fixed location data unit, a computer, a laptop, a tablet, a mobile phone, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for retaining matchline indication for a content addressable memory (CAM). Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
a matchline receiver configured to receive a matchline of a content-addressable memory (CAM), wherein the matchline is configured to provide a hit/miss indication for a search operation of a data word of the CAM corresponding to the matchline;
wherein the matchline receiver comprises a retention circuit configured to retain, on a hit/miss output, the hit/miss indication provided by the matchline during a first clock phase of a clock, even if the matchline is modified during the first clock phase.

2. The apparatus of claim 1, wherein the matchline is configured to be modified by a write operation or an invalidation operation during the first clock phase.

3. The apparatus of claim 2, wherein the retention circuit comprises:
a hit retention circuit configured to retain, on the hit/miss output, a hit indication provided by the matchline.

4. The apparatus of claim 3, wherein the hit retention circuit comprises an or-and-invert (OAI) logic, wherein an input of the OAI logic is coupled to a feedback path from the hit/miss output and another input of the OAI logic is coupled to the matchline.

5. The apparatus of claim 4, wherein the feedback path comprises a delay circuit configured to provide a delayed version of the hit/miss output to the OAI logic.

6. The apparatus of claim 5, wherein the delayed version of the hit/miss output is configured to hold the hit indication provided by the matchline even if the hit/miss output changes.

7. The apparatus of claim 3, wherein the retention circuit further comprises:
a miss retention circuit, configured to retain, on the hit/miss output, a miss indication provided by the matchline.

8. The apparatus of claim 7, wherein the miss retention circuit comprises pull-down transistors configured to hold the matchline in a miss state.

9. The apparatus of claim 3, further comprising a valid cell configured to indicate if the data word comprises valid data, wherein the hit retention circuit is configured to retain, on the hit/miss output, the hit indication provided by the matchline, even if the valid cell is modified by an invalidation operation to indicate that data stored in the data word is invalid.

10. The apparatus of claim 1, wherein the retention circuit is configured to set the hit/miss output to a miss state in a second clock phase of the clock.

11. The apparatus of claim 10, wherein the clock is high in the first clock phase and low in the second clock phase.

12. The apparatus of claim 1, wherein the retention circuit comprises a hit retention circuit configured to retain, on the hit/miss output, a hit indication provided by the matchline, wherein the hit retention circuit comprises logic configured to prolong retention of the hit indication in the first clock phase.

13. The apparatus of claim 1, integrated into a device selected from the group consisting of a set top box, music player, video player, entertainment unit, navigation device, communications device, personal digital assistant (PDA), fixed location data unit, and a computer.

14. A method of operating a matchline receiver, the method comprising:
receiving a hit/miss indication for a search operation of a data word of a content-addressable memory (CAM) from a matchline corresponding to the data word; and
retaining the hit/miss indication at a hit/miss output of the matchline receiver during a first clock phase of a clock, even if the matchline is modified during the first clock phase.

15. The method of claim 14, comprising retaining the hit/miss indication at a hit/miss output of the matchline receiver during a first clock phase of a clock, even if the matchline is modified by a write operation or an invalidation operation during the first clock phase.

16. The method of claim 15, comprising:

retaining, using or-and-invert (OAI) logic, a hit indication provided by the matchline on the hit/miss output, by providing a feedback path from the hit/miss output as an input of the OAI logic and providing the matchline as another input of the OAI logic.

17. The method of claim 16, comprising providing a delayed version of the hit/miss output in the feedback path.

18. The method of claim 16, further comprising retaining the matchline in a miss state using pull-down transistors.

19. The method of claim 14, further comprising setting the hit/miss output in a miss state in a second clock phase of the clock.

20. The method of claim 19, wherein the clock is high in the first clock phase and low in the second clock phase.

21. An apparatus comprising:

means for receiving a hit/miss indication for a search operation of a data word of a content-addressable memory (CAM) from a matchline corresponding to the data word; and means for retaining the hit/miss indication at a hit/miss output of the matchline receiver during a first clock phase of a clock, even if the matchline is modified by a write operation or an invalidation operation during the first clock phase.

\* \* \* \* \*